US008180071B2

(12) United States Patent
Yamazaki et al.

(10) Patent No.: US 8,180,071 B2
(45) Date of Patent: May 15, 2012

(54) PSEUDO DEEP BASS GENERATING DEVICE

(75) Inventors: Takashi Yamazaki, Tokyo (JP); Masaru Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 951 days.

(21) Appl. No.: 12/187,703

(22) Filed: Aug. 7, 2008

(65) Prior Publication Data

US 2009/0052694 A1 Feb. 26, 2009

(30) Foreign Application Priority Data

Aug. 10, 2007 (JP) ................................ 2007-209933

(51) Int. Cl.
*H03G 5/00* (2006.01)

(52) U.S. Cl. ............................ 381/98; 381/61; 381/349

(58) Field of Classification Search .................... 381/61, 381/74, 98, 309, 349
See application file for complete search history.

(56) References Cited

U.S. PATENT DOCUMENTS

| | | | | |
|---|---|---|---|---|
| 4,451,858 | A * | 5/1984 | Johnson, Jr. | 360/32 |
| 6,069,979 | A * | 5/2000 | VanMetter | 382/260 |
| 6,111,960 | A * | 8/2000 | Aarts et al. | 381/61 |
| 6,134,330 | A * | 10/2000 | De Poortere et al. | 381/61 |
| 7,317,800 | B1 * | 1/2008 | Vierthaler et al. | 381/61 |
| 2004/0022400 | A1 * | 2/2004 | Magrath | 381/106 |
| 2005/0141727 | A1 * | 6/2005 | Vierthaler | 381/61 |
| 2006/0159283 | A1 * | 7/2006 | Mathew et al. | 381/98 |
| 2007/0127731 | A1 * | 6/2007 | Aarts et al. | 381/61 |

FOREIGN PATENT DOCUMENTS

| | | |
|---|---|---|
| JP | 11-509712 | 8/1998 |
| JP | 2005-318598 | 11/2005 |

* cited by examiner

*Primary Examiner* — Bradley K Smith
*Assistant Examiner* — Duy Nguyen
(74) *Attorney, Agent, or Firm* — Oblon, Spivak, McClelland, Maier & Neustadt, L.L.P.

(57) ABSTRACT

A multiplier 3 multiplies a square wave signal A(ω,t) by a low frequency component signal L(ω,t) to generate an even-order harmonic component signal B(ω,t). A multiplier 4 multiplies the even-order harmonic component signal B(ω,t) by the low frequency component signal L(ω,t) to generate an odd-order harmonic component signal C(ω,t). An adder 5 adds the even-order harmonic component signal B(ω,t) and the odd-order harmonic component signal C(ω,t) to generate the harmonic component signal D(ω,t).

8 Claims, 11 Drawing Sheets

PSEUDO DEEP BASS GENERATING DEVICE

BACKGROUND OF THE INVENTION

1. Field of the Invention

The present invention relates to a pseudo deep bass generating device which causes users to pseudoly perceive a bass sound in a band which is difficult for speakers to reproduce.

2. Description of Related Art

In recent years, there has been a tendency to place importance on housing design for a liquid crystal DTV and the like, and a slimmed liquid crystal DTV and the like have been accepted.

Therefore, there has been a tendency to downsize speakers mounted in a liquid crystal DTV or the like, it becomes difficult to provide an adequate feeling of a bass sound according to the downsizing.

A technology of using "Missing fundamental" which is one of psychoacoustics features is known as a technology of providing a feeling of a bass sound.

"Missing fundamental" is a feature of making a user hear two or more sounds of different frequencies simultaneously in such a way that users can have an illusion that he or she hears a sound having a frequency which is the difference between them.

A pseudo deep bass generating device which uses "Missing fundamental" is disclosed by the following patent reference 1.

This pseudo deep bass generating device generates a harmonic component signal from a low frequency component signal having a frequency equal to or lower than the lowest reproduction frequency f0 of a speaker, and adds the harmonic component signal to the original signal.

More specifically, the pseudo deep bass generating device generates an odd-order harmonic component signal by peak-holding the low frequency component signal having a frequency equal to or lower than the lowest reproduction frequency f0 of the speaker, and also generates an even-order harmonic component signal by half-wave-rectifying the odd-order harmonic component signal.

In the generation of the odd-order harmonic component signal with the peak holding, a sampled value to be outputted is determined by comparing an immediately previous sampled value with a current sampled value.

For example, in a case in which the current sampled value is positive, the output value is the immediately previous sampled value if the current sampled value is smaller than the immediately previous sampled value, whereas if the current sampled value is larger than the immediately previous sampled value, the output value is the current sampled value.

In contrast, in a case in which the current sampled value is negative, the output value is the immediately previous sampled value if the current sampled value is larger than the immediately previous sampled value, whereas if the current sampled value is smaller than the immediately previous sampled value, the output value is the current sampled value.

Therefore, when the sign of the sampled value is inverted, a discontinuous point appears. This results in a rapid change in the amplitude value, and therefore the stability may be lost from the sound and the sound quality may degrade.

FIG. 14 is an explanatory drawing showing an example of the generation of the odd-order harmonic component signal with the peak holding in the form of time waveforms. A time waveform on the left side of FIG. 14 shows a sine wave of 50 Hz, and a time waveform on the right side of FIG. 14 shows the odd-order harmonic component signal generated with the peak holding.

As can be seen from FIG. 14, because when the sign of the sampled value is inverted, the signal becomes discontinuous and hence the amplitude value varies rapidly, the sound quality degrades.

[Patent reference 1] JP,2005-318598,A (see paragraph numbers [0024]to [0032] and FIG. 1)

Because the conventional pseudo deep bass generating device is constructed as mentioned above, the conventional pseudo deep bass generating device can cause users to pseudoly perceive a bass sound in a band which is difficult for speakers to reproduce by peak-holding a low frequency component signal to generate an odd-order harmonic component signal, and then adding the odd-order harmonic component signal to the original signal. However, in the case of generating the odd-order harmonic component signal by peak-holding the low frequency component signal, the odd-order harmonic component signal becomes discontinuous when the sign of the low frequency component signal is inverted. Therefore, a problem is that a rapid change in the amplitude value causes degradation in the sound quality.

SUMMARY OF THE INVENTION

The present invention is made in order to solve the above-mentioned problem, and it is therefore an object of the present invention to provide a pseudo deep bass generating device which can cause users to pseudoly perceive a bass sound in a band which is difficult for speakers to reproduce without causing any degradation in the sound quality due to a rapid change of the amplitude value of a harmonic component signal generated thereby.

A pseudo deep bass generating device in accordance with the present invention includes an amplitude value compression signal generation means for generating an amplitude value compression signal from a low frequency component signal having a frequency equal to or lower than the lowest reproduction frequency of a speaker, a first multiplication means multiplies the amplitude value compression signal generated by the amplitude value compression signal generation means by the low frequency component signal so as to generate an even-order harmonic component signal, a second multiplication means multiplies the even-order harmonic component signal outputted from the first multiplication means by the low frequency component signal so as to generate an odd-order harmonic component signal, and an adding means adds the even-order harmonic component signal outputted from the first multiplication means and the odd-order harmonic component signal outputted from the second multiplication means so as to generate a harmonic component signal.

In accordance with the present invention, the amplitude value compression signal generation means for generating an amplitude value compression signal from a low frequency component signal having a frequency equal to or lower than the lowest reproduction frequency of a speaker is disposed, the first multiplication means is so constructed as to multiply the amplitude value compression signal generated by the amplitude value compression signal generation means by the low frequency component signal so as to generate an even-order harmonic component signal, the second multiplication means is so constructed as to multiply the even-order harmonic component signal outputted from the first multiplication means by the low frequency component signal so as to generate an odd-order harmonic component signal, and the adding means is so constructed as to add the even-order harmonic component signal outputted from the first multiplication means and the odd-order harmonic component signal outputted from the second multiplication means so as to generate a harmonic component signal. Therefore, the present invention provides an advantage of enabling users to pseudoly perceive a bass sound having a band which is difficult for the speaker to reproduce without causing any degradation in the sound quality due to a rapid change in the amplitude value of the generated harmonic component signal.

DETAILED DESCRIPTION OF THE PREFERRED EMBODIMENTS

Embodiment 1.

Figure 1:
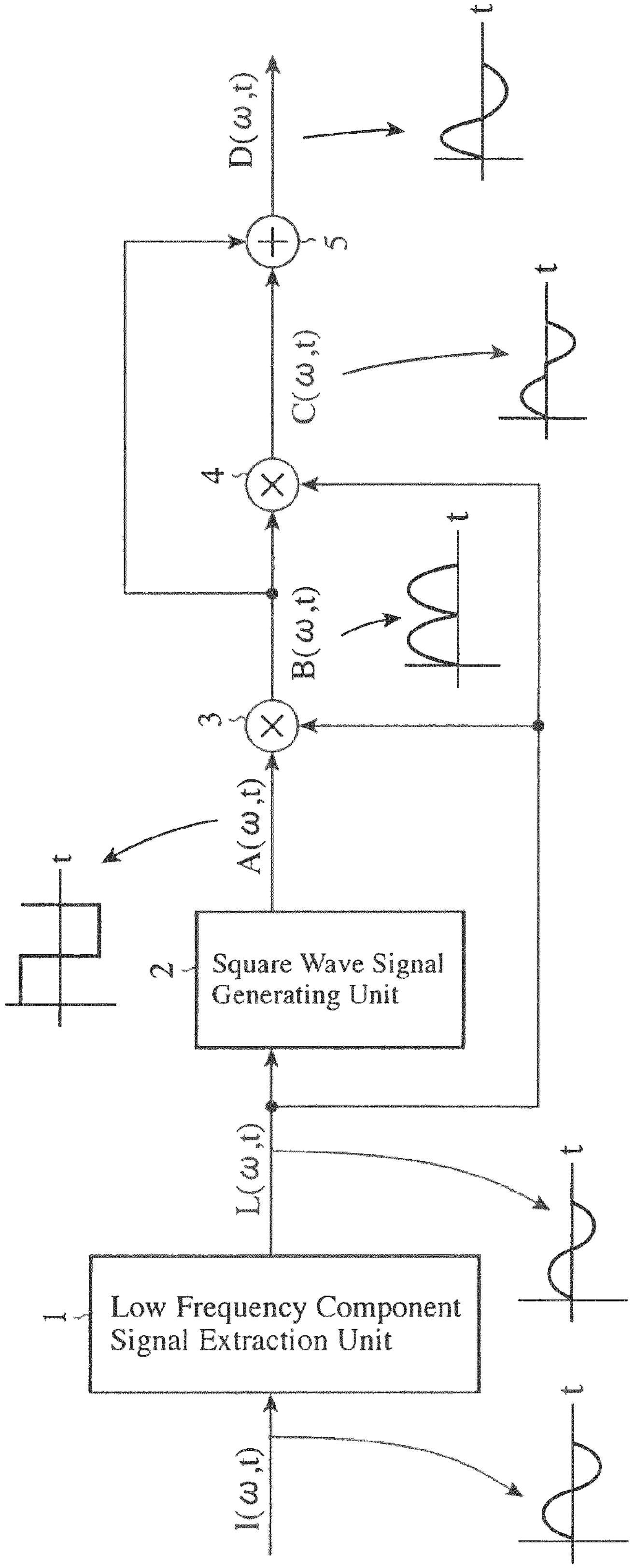
FIG. 1 is a block diagram showing a pseudo deep bass generating device in accordance with Embodiment 1 of the present invention.

FIG. 1 is a block diagram showing a pseudo deep bass generating device in accordance with Embodiment 1 of the present invention. In the figure, a low frequency component signal extraction unit 1 is constructed of, for example, a low pass filter, or a high pass filter for cutting sounds whose frequencies are close to that of a DC component, and carries out a process of extracting a low frequency component signal L(ω,t) having a frequency equal to or lower than the lowest reproduction frequency f0 of a speaker from an input signal I(ω,t). The low frequency component signal extraction unit 1 constructs a low frequency component signal extraction means.

A square wave signal generating unit 2 carries out a process of compressing the amplitude value of the low frequency component signal L(ω,t) extracted by low frequency component signal extraction unit 1 to output an amplitude value compression signal which is the low frequency component signal whose amplitude value has been compressed. More specifically, the square wave signal generating unit carries out a process of generating, as the amplitude value compression signal, a square wave signal A(ω,t) having a positive amplitude value a when the low frequency component signal L(ω,t) extracted by the low frequency component signal extraction unit 1 has a positive sign, or a negative amplitude value −a when the low frequency component signal L(ω,t) has a negative sign. The square wave signal generating unit 2 constructs an amplitude value compression signal generating means.

A multiplier 3 carries out a process of multiplying the square wave signal A(ω,t) generated by the square wave signal generating unit 2 by the low frequency component signal L(ω,t) extracted by the low frequency component signal extraction unit 1 to output an even-order harmonic component signal B(ω,t) which is the result of the multiplication of the square wave signal A(ω,t) by the low frequency component signal L(ω,t) to both a multiplier 4 and an adder 5. The multiplier 3 constructs a first multiplication means.

The multiplier 4 carries out a process of multiplying the even-order harmonic component signal B(ω,t) outputted from the multiplier 3 by the low frequency component signal L(ω,t) extracted by the low frequency component signal extraction unit 1 to output an odd-order harmonic component signal C(ω,t) which is the result of the multiplication of the even-order harmonic component signal B(ω,t) by the low frequency component signal L(ω,t) to the adder 5. The multiplier 4 constructs a second multiplication means.

The adder 5 carries out a process of adding the even-order harmonic component signal B(ω,t) outputted from the multiplier 3 and the odd-order harmonic component signal C(ω,t) outputted from the multiplier 4 to output a harmonic component signal D(ω,t) which is the result of the addition of the even-order harmonic component signal B(ω,t) and the odd-order harmonic component signal C(ω,t). The adder 5 constructs an adding means.

In the example of FIG. 1, the low frequency component signal extraction unit 1, the square wave signal generating unit 2, the multipliers 3 and 4, and the adder 5 which are the components of the pseudo deep bass generating device are constructed of pieces of hardware for exclusive use, respectively. As an alternative, in a case in which the pseudo deep bass generating device consists of a computer, a program in which the descriptions of the processes carried out respectively by the low frequency component signal extraction unit 1, the square wave signal generating unit 2, the multipliers 3 and 4, and the adder 5 are written can be stored in a memory of the computer, and the CPU of the computer can execute the program stored in the memory.

Next, the operation of the pseudo deep bass generating device will be explained.

The low frequency component signal extraction unit 1 is constructed of, for example, a low pass filter or a high pass filter, and extracts a low frequency component signal L(ω,t)

having a frequency equal to or lower than the lowest reproduction frequency f0 of the speaker from the input signal I(ω,t).

For example, if the lowest reproduction frequency f0 of the speaker is 100 Hz, the low frequency component signal extraction unit extracts a low frequency component signal of 100 Hz or lower.

$$L(\omega,t)=\sin\omega t \tag{1}$$

where ω is an angular frequency and t is a time.

In this case, an example in which it is assumed that the low frequency component signal L(ω,t) extracted by the low frequency component signal extraction unit 1 is a sine wave is shown, and the low frequency component signal L(ω,t) is delivered to the square wave signal generating unit 2 and the multipliers 3 and 4.

When receiving the low frequency component signal L(ω,t) from the low frequency component signal extraction unit 1, the square wave signal generating unit 2 generates a square wave signal A(ω,t) from the low frequency component signal L(ω,t).

More specifically, the square wave signal generating unit 2 generates a square wave signal A(ω,t) having a positive amplitude value a when the low frequency component signal L(ω,t) extracted by the low frequency component signal extraction unit 1 has a positive sign, or a negative amplitude value –a when the low frequency component signal L(ω,t) has a negative sign.

The following equation (2) shows the square wave signal A(ω,t) generated by the square wave signal generating unit 2, and it can be seen from this equation that the square wave signal A(ω,t) consists of a sum signal which is the sum of odd-order harmonic component signals.

Therefore, the generation of the square wave signal A(ω,t) is equivalent to generation of the odd-order harmonic component signals.

$$A(\omega,t)=\frac{4}{\pi}\sum_{m=1}^{\infty}\frac{\sin(2m-1)\omega t}{2m-1} \tag{2}$$

where $\omega$ is the angular frequency and $t$ is the time.

Although the square wave signal A(ω,t) generated by the square wave signal generating unit 2 consists of odd-order harmonics of the low frequency component signal, the square wave signal A(ω,t) does not follow the power of the low frequency component signal L(ω,t).

Therefore, because when the square wave signal A(ω,t) is used as odd-order harmonic components of the harmonic component signal just as it is, the sound quality degrades. To solve this problem, in accordance with this Embodiment 1, the multipliers 3 and 4 and the adder 5 are provided in such a way as to generate odd-order harmonic components of the harmonic component signal which follows the power of the low frequency component signal L(ω,t) from the square wave signal A(ω,t).

After the square wave signal generating unit 2 generates the square wave signal A(ω,t), the multiplier 3, as shown in the following equation (3), generates an even-order harmonic component signal B(ω,t) by multiplying the square wave signal A(ω,t) by the low frequency component signal L(ω,t) outputted from the low frequency component signal extraction unit 1, and outputs the even-order harmonic component signal B(ω,t) to the multiplier 4 and the adder 5.

$$\begin{aligned}B(\omega,t)&=L(\omega,t)\times A(\omega,t)\\&=(\sin\omega t)\cdot\left(\frac{4}{\pi}\sum_{m=1}^{\infty}\frac{\sin(2m-1)\omega t}{2m-1}\right)\\&=\frac{4}{\pi}\left(\sin^2\omega t+\frac{1}{3}\sin\omega t\sin 3\omega t+\frac{1}{5}\sin\omega t\sin 5\omega t+\right.\\&\qquad\left.\frac{1}{7}\sin\omega t\sin 7\omega t+\dots\right)\\&=\frac{2}{\pi}\left(1-\sum_{m=1}^{\infty}\left(\frac{1}{2m-1}-\frac{1}{2m+1}\right)\cos(2m\omega t)\right)\end{aligned} \tag{3}$$

Because the even-order harmonic component signal B(ω,t) generated by the multiplier 3 is a sum signal which is the sum of even-order harmonics, and is the multiplication by the low frequency component signal L(ω,t), the even-order harmonic component signal follows the power of the low frequency component signal L(ω,t).

Figure 2:
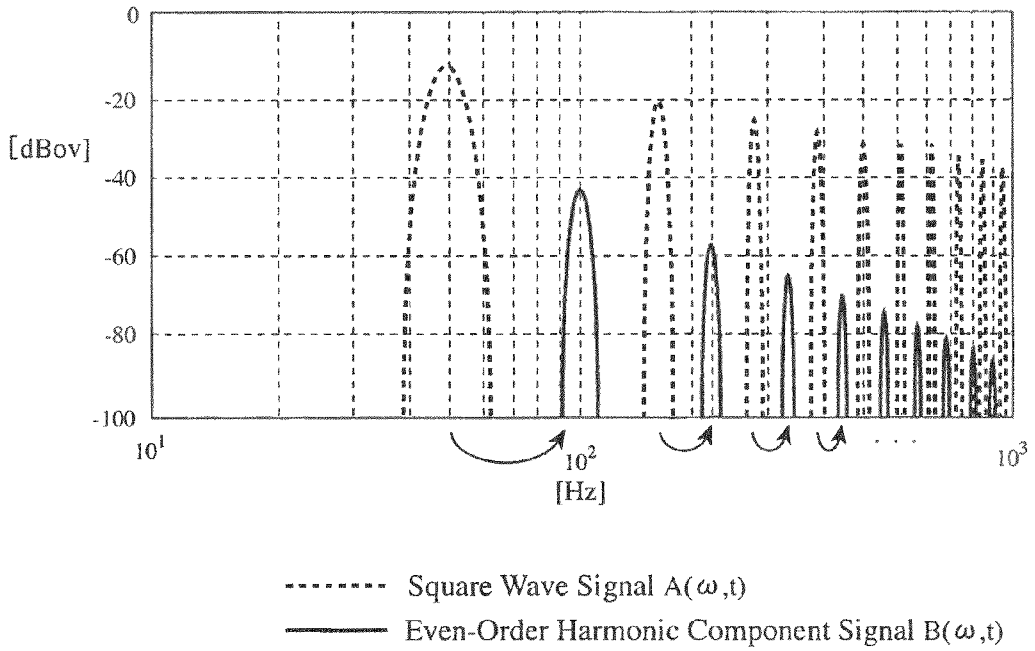
FIG. 2 is an explanatory drawing showing the frequency characteristics of a square wave signal A(ω,t) and an even-order harmonic component signal B(ω,t) in a case in which an input signal I(ω,t) is a sine wave of 50 Hz.

FIG. 2 is an explanatory drawing showing the frequency characteristics of the square wave signal A(ω,t) and the even-order harmonic component signal B(ω,t) in a case in which the input signal I (ω,t) is a sine wave of 50 Hz. In the figure, a dotted line shows the square wave signal A(ω,t), and a solid line shows the even-order harmonic component signal B(ω,t).

Because it can be considered that in the process carried out by the multiplier 3, the square wave signal A(ω,t) is amplitude-modulated with the low frequency component signal L(ω,t), the multiplier 3 can be assumed to shift the frequencies of the odd-order harmonic components of the square wave signal A(ω,t) by the frequency of the low frequency component signal L(ω,t) so as to generate the even-order harmonic component signal B(ω,t), as shown in FIG. 2.

When receiving the even-order harmonic component signal B(ω,t) from the multiplier 3, the multiplier 4, as shown in the following equation (4), generates an odd-order harmonic component signal C(ω,t) by multiplying the even-order harmonic component signal B (ω,t) by the low frequency component signal L(ω,t) outputted from the low frequency component signal extraction unit 1, and then outputs the odd-order harmonic component signal C(ω,t) to the adder 5.

$$\begin{aligned}C(\omega,t)&=L(\omega,t)\times B(\omega,t)\\&=(\sin\omega t)\cdot\frac{2}{\pi}\left(1-\sum_{m=1}^{\infty}\left(\frac{1}{2m-1}-\frac{1}{2m+1}\right)\cos(2m\omega t)\right)\\&=\frac{2}{\pi}\left(\sin\omega t+\frac{1}{3}\sin\omega t-\left(\frac{1}{1\cdot 3}-\frac{1}{3\cdot 5}\right)\sin 3\omega t-\right.\\&\qquad\left.\left(\frac{1}{3\cdot 5}-\frac{1}{5\cdot 7}\right)\sin 5\omega t-\left(\frac{1}{5\cdot 7}-\frac{1}{7\cdot 9}\right)\sin 7\omega t-\dots\right)\\&=-\frac{2}{\pi}\sum_{m=1}^{\infty}\frac{1}{2m-1}\cdot\left(\frac{1}{2m-3}-\frac{1}{2m+1}\right)\sin(2m-1)\omega t\end{aligned} \tag{4}$$

Because the odd-order harmonic component signal C(ω,t) generated by the multiplier 4 is a sum signal which is the sum of odd-order harmonics, and is the multiplication by the low frequency component signal L(ω,t), the odd-order harmonic component signal follows the power of the low frequency component signal L(ω,t).

Figure 3:
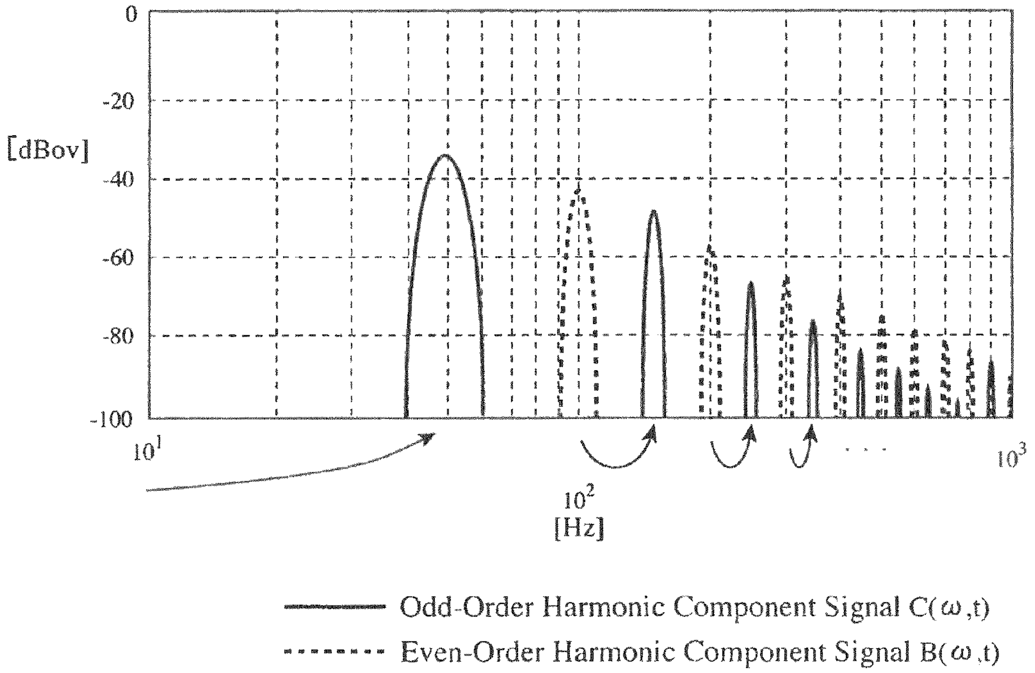
FIG. 3 is an explanatory drawing showing the frequency characteristics of the even-order harmonic component signal B(ω,t) and an odd-order harmonic component signal C(ω,t) in the case in which the input signal I(ω,t) is a sine wave of 50 Hz.

FIG. 3 is an explanatory drawing showing the frequency characteristics of the even-order harmonic component signal B(ω,t) and the odd-order harmonic component signal C(ω,t) in the case in which the input signal I(ω,t) is a sine wave of 50 Hz.

In the figure, a dotted line shows the even-order harmonic component signal B(ω,t), and a solid line shows the odd-order harmonic component signal C(ω,t).

Because it can be considered that in the process carried out by the multiplier 4, the even-order harmonic component signal B(ω,t) is amplitude-modulated with the low frequency component signal L(ω,t), the multiplier 4 can be assumed to shift the frequencies of the even-order harmonic components of the even-order harmonic component signal B(ω,t) by the frequency of the low frequency component signal L(ω,t) so as to generate the odd-order harmonic component signal C(ω,t), as shown in FIG. 3.

Figure 4:
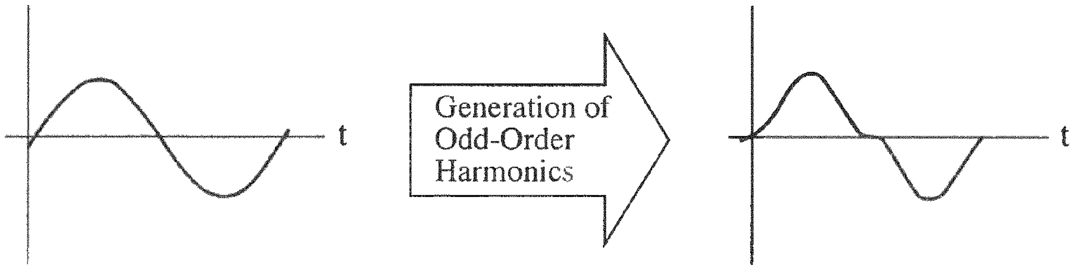
FIG. 4 is an explanatory drawing showing an example of generation of the odd-order harmonic component signal in the form of time waveforms.

FIG. 4 is an explanatory drawing showing an example of the generation of the odd-order harmonic component signal in the form of time waveforms.

A time waveform on the left side of FIG. 4 shows the sine wave of 50 Hz, and a time waveform on the right side of FIG. 4 shows the odd-order harmonic component signal C(ω,t) generated by the multiplier 4.

As can be seen from FIG. 4, because there is no signal discontinuous point at the time when the sign is inverted and the amplitude value does not vary rapidly, the pseudo deep bass generating device is able to reproduce a sound with good quality.

When the adder 5 receives the even-order harmonic component signal B(ω,t) from the multiplier 3 and also receives the odd-order harmonic component signal C(ω,t) from the multiplier 4, the adder generates a harmonic component signal D(ω, t) by adding the even-order harmonic component signal B(ω,t) and the odd-order harmonic component signal C(ω,t), and then outputs the harmonic component signal D(ω, t).

$$D(\omega,t)=B(\omega,t)+C(\omega,t) \tag{5}$$

Figure 5:
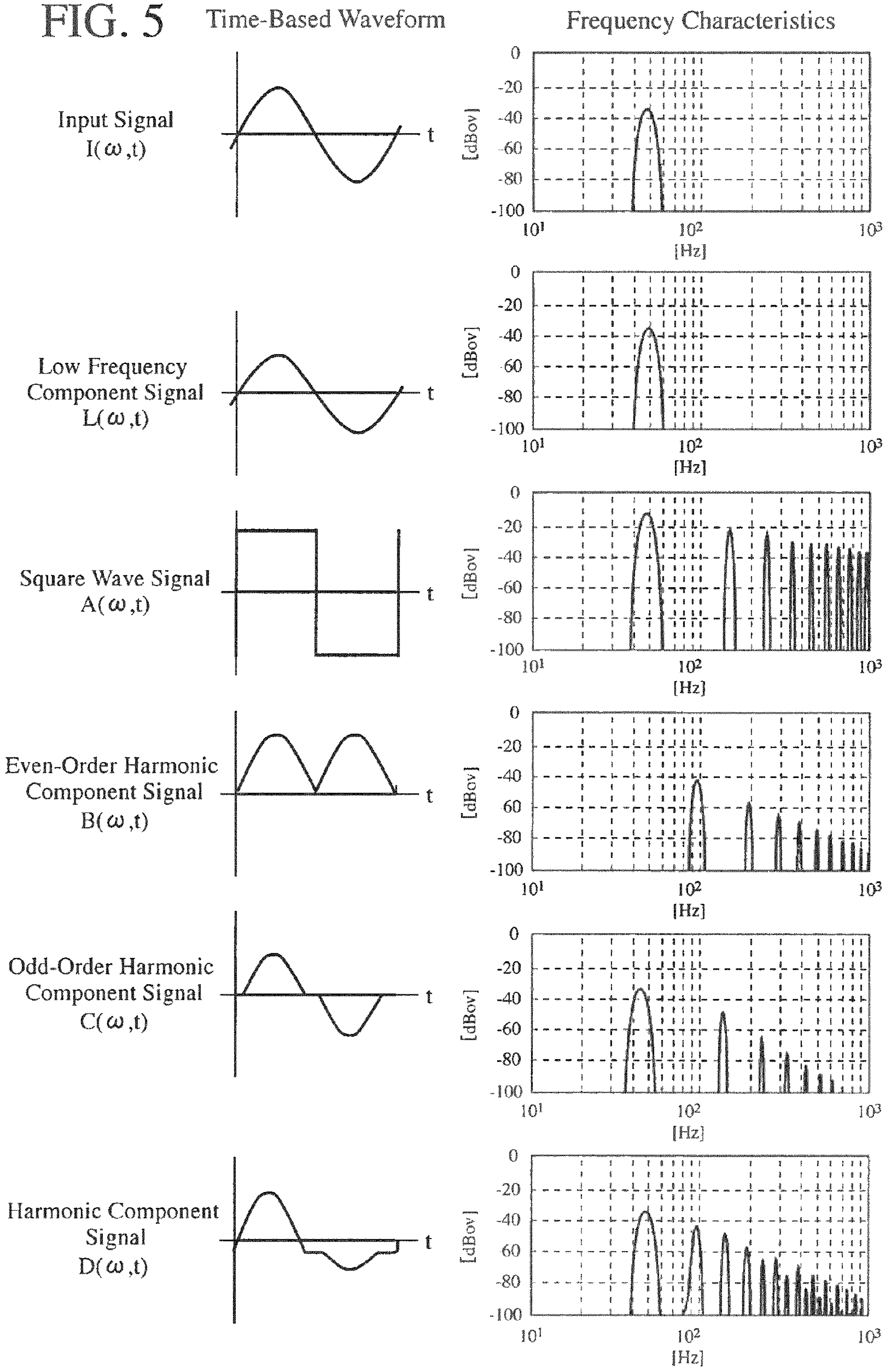
FIG. 5 is an explanatory drawing showing an example of the time-based waveforms and frequency characteristics of the input signal I(ω,t), a low frequency component signal L(ω,t), the square wave signal A(ω,t), the even-order harmonic component signal B(ω,t), the odd-order harmonic component signal C(ω,t), and a harmonic component signal D(ω,t)

FIG. 5 is an explanatory drawing showing an example of the time-based waveforms and frequency characteristics of the input signal I(ω,t), the low frequency component signal L(ω,t), the square wave signal A(ω,t), the even-order harmonic component signal B(ω,t), the odd-order harmonic component signal C(ω,t), and the harmonic component signal D(ω,t), and shows a flow of the series of processes carried out by the pseudo deep bass generating device of this Embodiment 1.

Although in FIG. 5 the example in which the sine wave of 50 Hz is inputted as the input signal I(ω,t) is shown, a signal having the same tendency can be acquired even when a sine wave having another frequency is inputted.

As can be seen from the above description, in accordance with this embodiment 1, the square wave signal generating unit 2 for generating a square wave signal A(ω,t) from a low frequency component signal L(ω,t) having a frequency equal to or lower than the lowest reproduction frequency f0 of the speaker is disposed, the multiplier 3 is so constructed as to multiply the square wave signal A(ω,t) generated by the square wave signal generating unit 2 by the low frequency component signal L(ω,t) to generate an even-order harmonic component signal B(ω,t), the multiplier 4 is so constructed as to multiply the even-order harmonic component signal B(ω,t) outputted from the multiplier 3 by the low frequency component signal L(ω,t) to generate an odd-order harmonic component signal C(ω,t), and the adder 5 is so constructed as to add the even-order harmonic component signal B(ω,t) outputted from the multiplier 3 and the odd-order harmonic component signal C(ω,t) outputted from the multiplier 4 to generate a harmonic component signal D(ω,t). Therefore, this embodiment offers an advantage of being able to make users pseudoly perceive a bass sound having a band which is difficult for the speaker to reproduce without causing any degradation in the sound quality due to a rapid change in the amplitude value of the harmonic component signal D(ω,t).

This Embodiment 1 offers another advantage of being able to reproduce the sound naturally because the even-order harmonic component signal B(ω,t) generated by the multiplier 3 and the odd-order harmonic component signal C(ω,t) generated by the multiplier 4 follow the power of the low frequency component signal L(ω,t).

This embodiment offers a further advantage of being able to eliminate the necessity to perform, as postpocessing, power adjustment and so on, and to contribute to a reduced amount of arithmetic operations because the harmonic component signal D(ω,t) generated by the adder 5 is a sum signal which is the sum of the even-order harmonic component signal B(ω,t) and the odd-order harmonic component signal C(ω,t) and follows the power of the low frequency component signal L(ω,t).

Embodiment 2.

Figure 6:
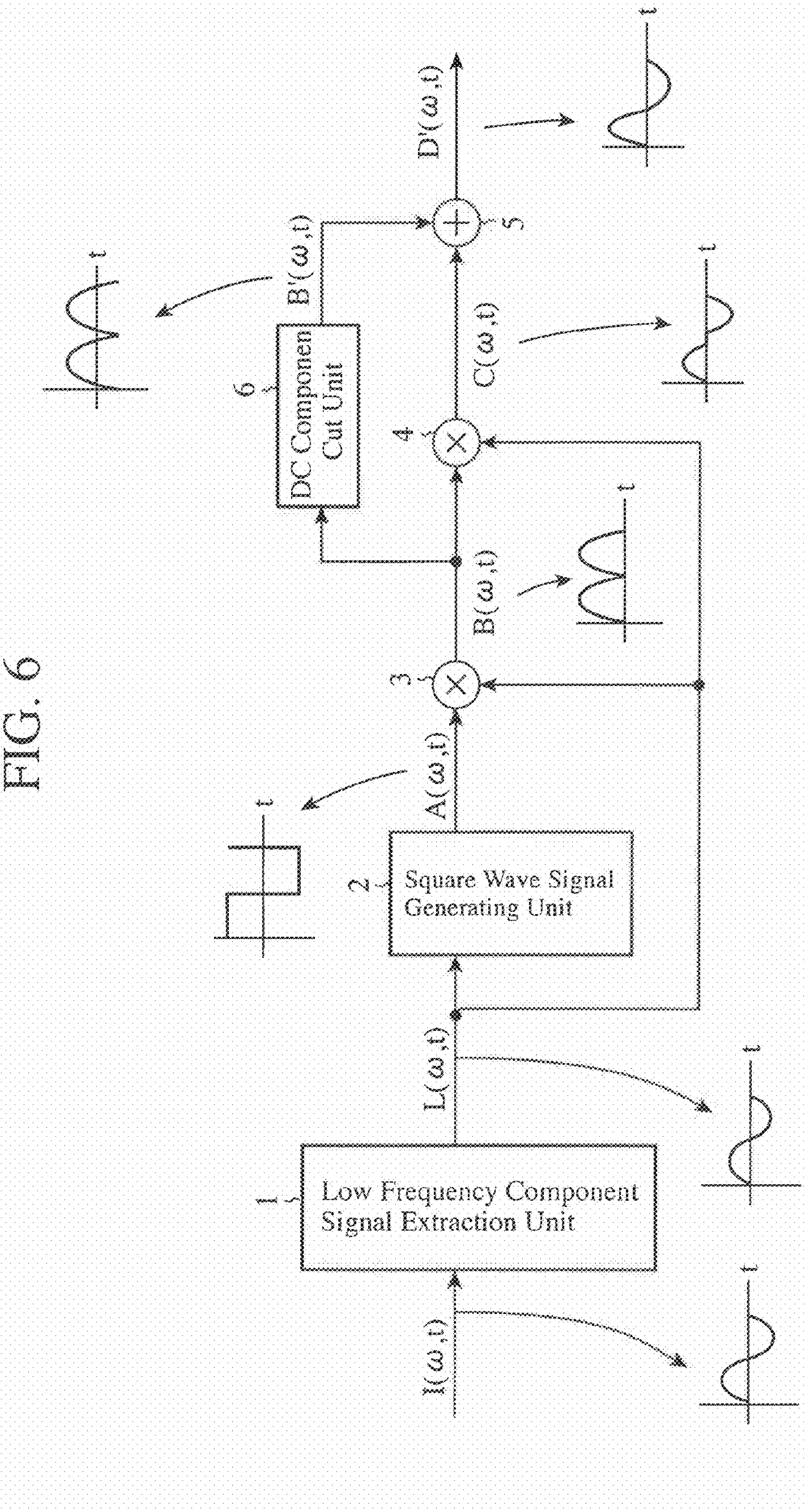
FIG. 6 is a block diagram showing a pseudo deep bass generating device in accordance with Embodiment 2 of the present invention.

FIG. 6 is a block diagram showing a pseudo deep bass generating device in accordance with Embodiment 2 of the present invention. In the figure, because the same reference numerals as those shown in FIG. 1 denote the same components or like components, the explanation of these components will be omitted hereafter.

A DC component cut unit 6 carries out a process of removing a DC component (dc component) from an even-order harmonic component signal B(ω,t) outputted from a multiplier 3, and outputting an even-order harmonic component signal B'(ω,t) from which the DC component has been removed to an adder 5. The DC component cut unit 6 constructs a DC component removing means.

Next, the operation of the pseudo deep bass generating device will be explained.

The multiplier 3 generates an even-order harmonic component signal B(ω,t) by, as previously mentioned, multiplying a square wave signal A(ω,t) generated by a square wave signal generating unit 2 by a low frequency component signal L(ω,t) extracted by a low frequency component signal extraction unit 1. The even-order harmonic component signal B(ω, t) includes a DC component of 2/π, as can also be seen from the equation (3).

In the case in which the even-order harmonic component signal B(ω,t) thus includes a DC component, the even-order harmonic component signal is easy to be clipped on the positive side because this signal includes the DC component in addition to the original even-order harmonic components. When the even-order harmonic component signal is clipped, the sound becomes distorted and its sound quality degrades.

To solve this problem, in accordance with this Embodiment 2, the DC component cut unit 6 removes the DC component from the even-order harmonic component signal B(ω, t) outputted from the multiplier 3.

More specifically, when receiving the even-order harmonic component signal B(ω,t) from the multiplier 3, the DC component cut unit 6 calculates the average of the even-order harmonic component signal B(ω,t) for each frame.

The DC component cut unit 6 then judges that the above-mentioned average is the DC component, and removes the DC component from the even-order harmonic component signal B(ω,t) by subtracting the above-mentioned average from the even-order harmonic component signal B(ω,t), and outputs an even-order harmonic component signal B(ω,t) from which the DC component has been removed to the adder 5.

When receiving the even-order harmonic component signal B'(ω,t) from which the DC component has been removed from the DC component cut unit 6 and also receiving an odd-order harmonic component signal C(ω,t) from a multiplier 4, the adder 5 generates a harmonic component signal D'(ω,t) by adding the even-order harmonic component signal B'(ω,t) and the odd-order harmonic component signal C(ω,t), and outputs the harmonic component signal D'(ω,t).

$$D'(\omega,t)=B'(\omega,t)+C(\omega,t) \quad (6)$$

As can be seen from the above description, in accordance with this embodiment 2, the DC component cut unit 6 is so constructed as to remove the DC component from the even-order harmonic component signal B(ω,t) outputted from the multiplier 3, and then outputs the even-order harmonic component signal B'(ω,t) from which the DC component has been removed to the adder 5. Therefore, the present embodiment offers an advantage of being able to prevent degradation in the sound quality.

Embodiment 3.

Figure 7:
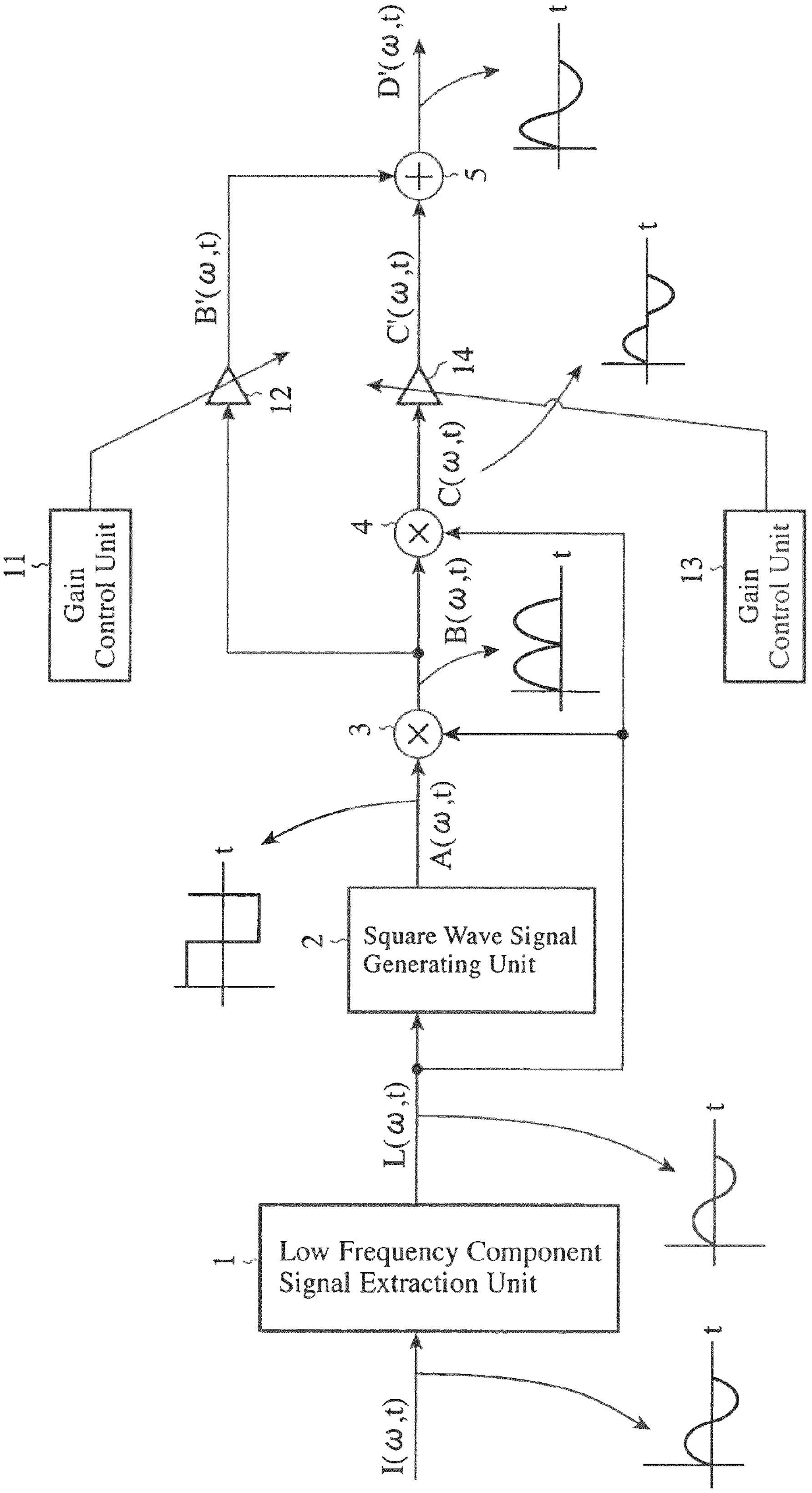
FIG. 7 is a block diagram showing a pseudo deep bass generating device in accordance with Embodiment 3 of the present invention.

FIG. 7 is a block diagram showing a pseudo deep bass generating device in accordance with Embodiment 3 of the present invention. In the figure, because the same reference numerals as those shown in FIG. 1 denote the same components or like components, the explanation of these components will be omitted hereafter.

A gain adjustment unit 11 is equipped with, for example, a man machine interface, and carries out a process of receiving a setting of a gain value by which a multiplier 12 multiplies an input signal.

The multiplier 12 carries out a process of adjusting the gain of an even-order harmonic component signal B(ω,t) outputted from a multiplier 3 by multiplying the even-order harmonic component signal B(ω,t) by the gain value the setting of which has been received by the gain adjustment unit 11.

A gain adjustment unit 13 is equipped with, for example, a man machine interface, and carries out a process of receiving a setting of a gain value by which a multiplier 14 multiplies an input signal.

The multiplier 14 carries out a process of adjusting the gain of an odd-order harmonic component signal C(ω,t) outputted from a multiplier 4 by multiplying the odd-order harmonic component signal C(ω,t) by the gain value the setting of which has been received by the gain adjustment unit 13.

The gain adjustment units 11 and 13 and the multipliers 12 and 14 construct a gain adjustment means.

Next, the operation of the pseudo deep bass generating device will be explained.

A harmonic component signal D(ω,t) generated by an adder 5 is a sum signal which is the sum of the even-order harmonic component signal and the odd-order harmonic component signal, and the even-order harmonic component signal has a feature of making users hear the sound as a "warm sound" and the odd-order harmonic component signal has a feature of making users hear the sound as a "hard sound".

Therefore, the pseudo deep bass generating device in accordance with this Embodiment 3 enables users to adjust the gain of the even-order harmonic component signal and that of the odd-order harmonic component signal in order for users to be able to make the pseudo deep bass generating device reproduce the sound in a favorite tone.

More specifically, the gain adjustment unit 11 receives the setting of the gain value by which the multiplier 12 multiplies the input signal, and outputs the gain value set up by a user to the multiplier 12.

Furthermore, the gain adjustment unit 13 receives the setting of the gain value by which the multiplier 14 multiplies the input signal, and outputs the gain value set up by the user to the multiplier 14.

When receiving the gain value from the gain adjustment unit 11, the multiplier 12 adjusts the gain of the even-order harmonic component signal B(ω,t) outputted from the multiplier 3 by multiplying the even-order harmonic component signal B(ω,t) by the gain value, and outputs the even-order harmonic component signal B'(ω,t) whose gain has been adjusted to the adder 5.

When receiving the gain value from the gain adjustment unit 13, the multiplier 14 adjusts the gain of the odd-order harmonic component signal C(ω,t) outputted from the multiplier 4 by multiplying the odd-order harmonic component signal C(ω,t) by the gain value, and outputs the odd-order harmonic component signal C'(ω,t) whose gain has been adjusted to the adder 5.

When receiving the even-order harmonic component signal B'(ω,t) whose gain has been adjusted from the multiplier 12 and also receiving the odd-order harmonic component signal C'(ω,t) whose gain has been adjusted from the multiplier 14, the adder 5 generates a harmonic component signal D'(ω,t) by adding the even-order harmonic component signal B'(ω,t) and the odd-order harmonic component signal C'(ω,t), and then outputs the harmonic component signal D'(ω,t).

$$D'(\omega,t)=B'(\omega,t)+C'(\omega,t) \quad (7)$$

As can be seen from the above description, in accordance with this embodiment 3, the multiplier 12 is so constructed as to multiply the even-order harmonic component signal B(ω,t) outputted from the multiplier 3 by the gain value the setting of which has been received by the gain adjustment unit 11 so as to adjust the gain of the even-order harmonic component signal B(ω,t), and the multiplier 14 is so constructed as to multiply the odd-order harmonic component signal C(ω,t) outputted from the multiplier 4 by the gain value the setting of which has been received by the gain adjustment unit 13 so as to adjust the gain of the odd-order harmonic component signal C(ω,t). Therefore, the present embodiment offers an advantage of being able to enable users to make the pseudo deep bass generating device reproduce the sound in his or her favorite tone, and, as a result, to reproduce the sound more naturally.

Embodiment 4.

Figure 8:
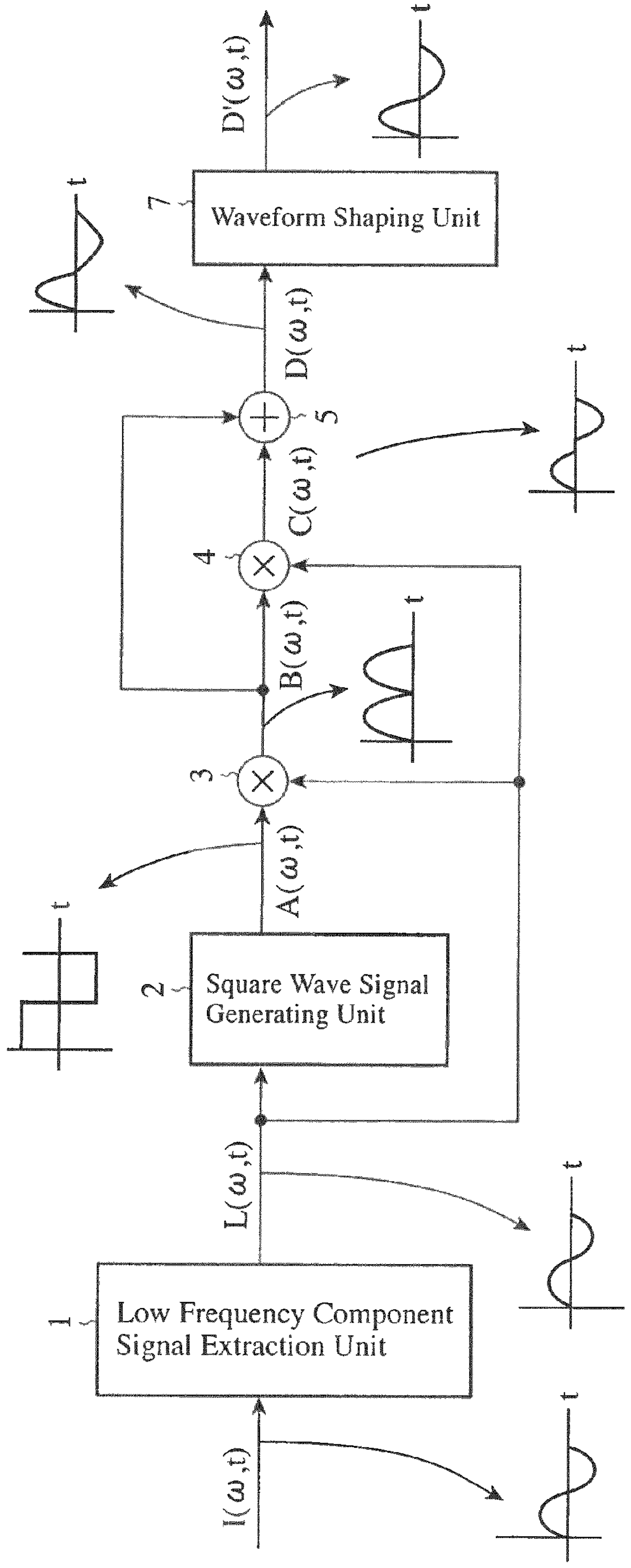
FIG. 8 is a block diagram showing a pseudo deep bass generating device in accordance with Embodiment 4 of the present invention.

FIG. 8 is a block diagram showing a pseudo deep bass generating device in accordance with Embodiment 4 of the present invention. In the figure, because the same reference numerals as those shown in FIG. 1 denote the same components or like components, the explanation of these components will be omitted hereafter.

A waveform shaping unit 7 is comprised, for example, a low pass filter, and carries out a waveform shaping process of removing high-order harmonic components, e.g., fourth- and higher-order harmonic components from a harmonic component signal D(ω,t). The waveform shaping unit 7 constructs a waveform shaping means.

Next, the operation of the pseudo deep bass generating device will be explained.

The harmonic component signal D(ω,t) generated by an adder 5 includes high-order harmonic components, and these high-order harmonic components tend to be perceived by a human being's ears and may cause degradation in the sound quality.

Therefore, in accordance with this Embodiment 4, for example, the waveform shaping unit 7 removes fourth- and higher-order harmonic components from the harmonic component signal D(ω,t) and outputs only third- and lower-order harmonic components.

As can be seen from the above description, in accordance with this embodiment 4, for example, the waveform shaping unit 7 is so constructed as to remove fourth- and higher-order harmonic components from the harmonic component signal D(ω,t). Therefore, the present embodiment offers an advantage of being able to eliminate high-order harmonic components which are easy to be perceived by a human being's ears and which cause degradation in the sound quality, and to reproduce the sound with good quality.

The present embodiment offers another advantage of being able to reduce the gain of the higher one of adjacent harmonic components and hence to reproduce the sound with good quality by making the harmonic component signal D(ω,t) pass through the waveform shaping unit 7 which is a low pass filter.

In this Embodiment 4, the example in which fourth- and higher-order harmonic components are removed from the harmonic component signal D(ω,t) is shown, though this embodiment is not limited to the removal of fourth- and higher-order harmonic components from the harmonic component signal. For example, fifth- and higher-order harmonic components can be removed from the harmonic component signal.

Embodiment 5.

Figure 9:
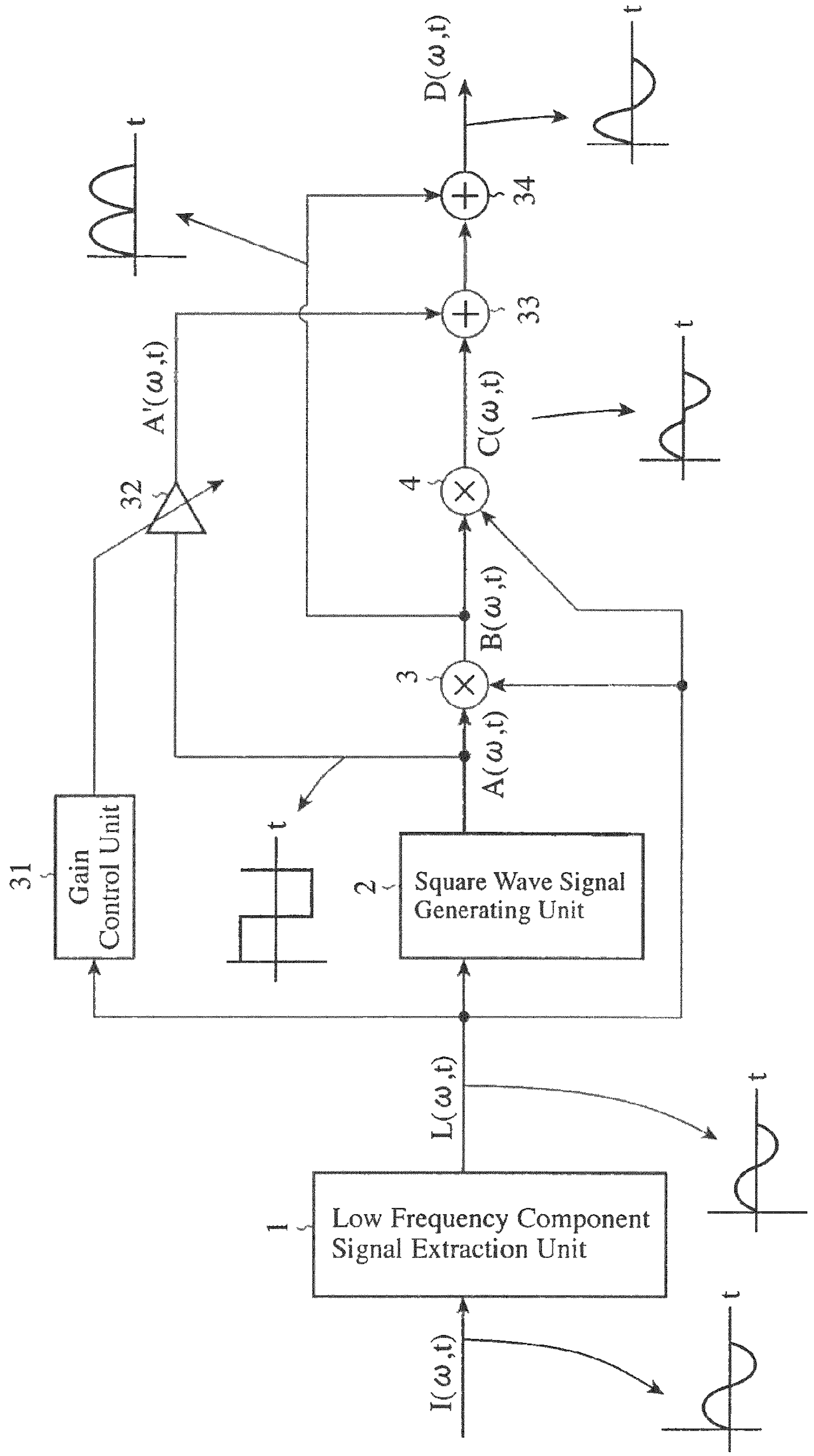
FIG. 9 is a block diagram showing a pseudo deep bass generating device in accordance with Embodiment 5 of the present invention.

FIG. 9 is a block diagram showing a pseudo deep bass generating device in accordance with Embodiment 5 of the present invention. In the figure, because the same reference numerals as those shown in FIG. 1 denote the same components or like components, the explanation of these components will be omitted hereafter.

A gain control unit 31 carries out a process of calculating the gain of a low frequency component signal L(ω,t) extracted by a low frequency component signal extraction unit 1 so as to control a gain value by which a multiplier 32 multiplies an input signal according to the gain.

The multiplier 32 carries out a process of adjusting the gain of a square wave signal A(ω,t) generated by a square wave signal generating unit 2 by multiplying the square wave signal A(ω,t) by the gain value outputted from the gain control unit 31.

The gain control unit 31 and the multiplier 32 construct a gain adjustment means.

An adder 33 which is a first adder carries out a process of adding the square wave signal A'(ω,t) whose gain has been adjusted by the multiplier 32, and an odd-order harmonic component signal C(ω,t) outputted from a multiplier 4.

An adder 34 which is a second adder carries out a process of adding the result of the addition by the adder 33 and an even-order harmonic component signal outputted from a multiplier 3, and outputting a harmonic component signal D(ω,t) which is the result of the addition of the square wave signal A'(ω,t) and the even-order harmonic component signal B(ω, t), and the odd-order harmonic component signal C(ω,t).

The adders 33 and 34 construct an adding means.

Next, the operation of the pseudo deep bass generating device will be explained.

In accordance with above-mentioned Embodiment 1, though the multiplier 4 generates the odd-order harmonic component signal C(ω,t) by multiplying the even-order harmonic component signal B(ω,t) from the multiplier 3 by the low frequency component signal L(ω,t) outputted from the low frequency component signal extraction unit 1, when the gain of the input signal I(ω,t) is small, the effect of making users perceive a bass range of the sound more keenly is reduced.

In this case, if the gains of harmonic components are simply increased, the effect of making users perceive a bass range of the sound more keenly can be enhanced, but too much addition of harmonic components may cause degradation in the sound quality in such a way that the generated sound becomes distorted.

Therefore, in accordance with this Embodiment 5, when the gain of the input signal I(ω,t) is small, by doing in the following way, the effect of making users perceive a bass range of the sound more keenly can be enhanced without causing any degradation in the sound quality in such a way that the generated sound becomes distorted.

After the low frequency component signal extraction unit 1 extracts the low frequency component signal L(ω,t), the gain control unit 31 calculates the average gain of the low frequency component signal L(ω,t) for each frame. As an alternative, instead of calculating the average gain of the low frequency component signal L(ω,t) for each frame, the gain control unit can calculate the average gain of the low frequency component signal not for each frame but for each reference unit longer than each frame because the period of the low frequency component signal L(ω,t) is long.

After calculating the average gain of the low frequency component signal L(ω,t), the gain control unit 31 calculates the gain value by which the multiplier 32 multiplies the input signal according to the average gain, and then outputs the gain value to the multiplier 32.

For example, the gain control unit outputs the gain value which increases within the limits of not exceeding a maximum gain value with decrease in the average gain of the low frequency component signal L(ω,t) to the multiplier 32.

As an alternative, the gain control unit calculates the gain value of the multiplier 32 by substituting, as parameters, both a value which is higher than the average gain of the low frequency component signal L(ω,t) by a predetermined value, and a value which is lower than the average gain by a predetermined value into a predetermined secondary function, and then outputs the gain value to the multiplier 32.

When receiving the gain value from the gain control unit 31, the multiplier 32 multiplies the square wave signal A(ω,t) generated by the square wave signal generating unit 2 by the gain value so as to adjust the gain of the square wave signal A(ω,t), and then outputs the square wave signal A'(ω,t) whose gain has been adjusted to the adder 33.

When receiving the square wave signal A'(ω,t) whose gain has been adjusted from the multiplier 32 and also receiving the odd-order harmonic component signal C(ω,t) from the multiplier 4, the adder 33 adds the square wave signal A'(ω,t) and the odd-order harmonic component signal C(ω,t) and then outputs the addition result to the adder 34.

When receiving the addition result from the adder 33 and also receiving the even-order harmonic component signal B(ω,t) from the multiplier 3, the adder 34 adds the addition result (A'(ω,t)+C(ω,t)) and the even-order harmonic component signal B(ω,t) so as to generate a harmonic component signal D(ω,t) (=A'(ω,t)+B(ω,t)+C(ω,t)), and outputs the harmonic component signal D(ω,t).

As can be seen from the above description, the pseudo deep bass generating device in accordance with this embodiment 5 is so constructed as to adjust the gain of square wave signal A(ω,t) generated by the square wave signal generating unit 2 according to the gain of the low frequency component signal L(ω,t) extracted by the low frequency component signal extraction unit 1, and add the square wave signal A(ω,t) whose gain has been adjusted, the even-order harmonic component signal B(ω,t), and the odd-order harmonic component signal C(ω,t). Therefore, this embodiment offers an advantage of being able to, even when the gain of the input signal I(ω,t) is small, enhance the effect of making users perceive a bass range of the sound more keenly without causing any degradation in the sound quality in such a way that the generated sound becomes distorted.

Figure 10:
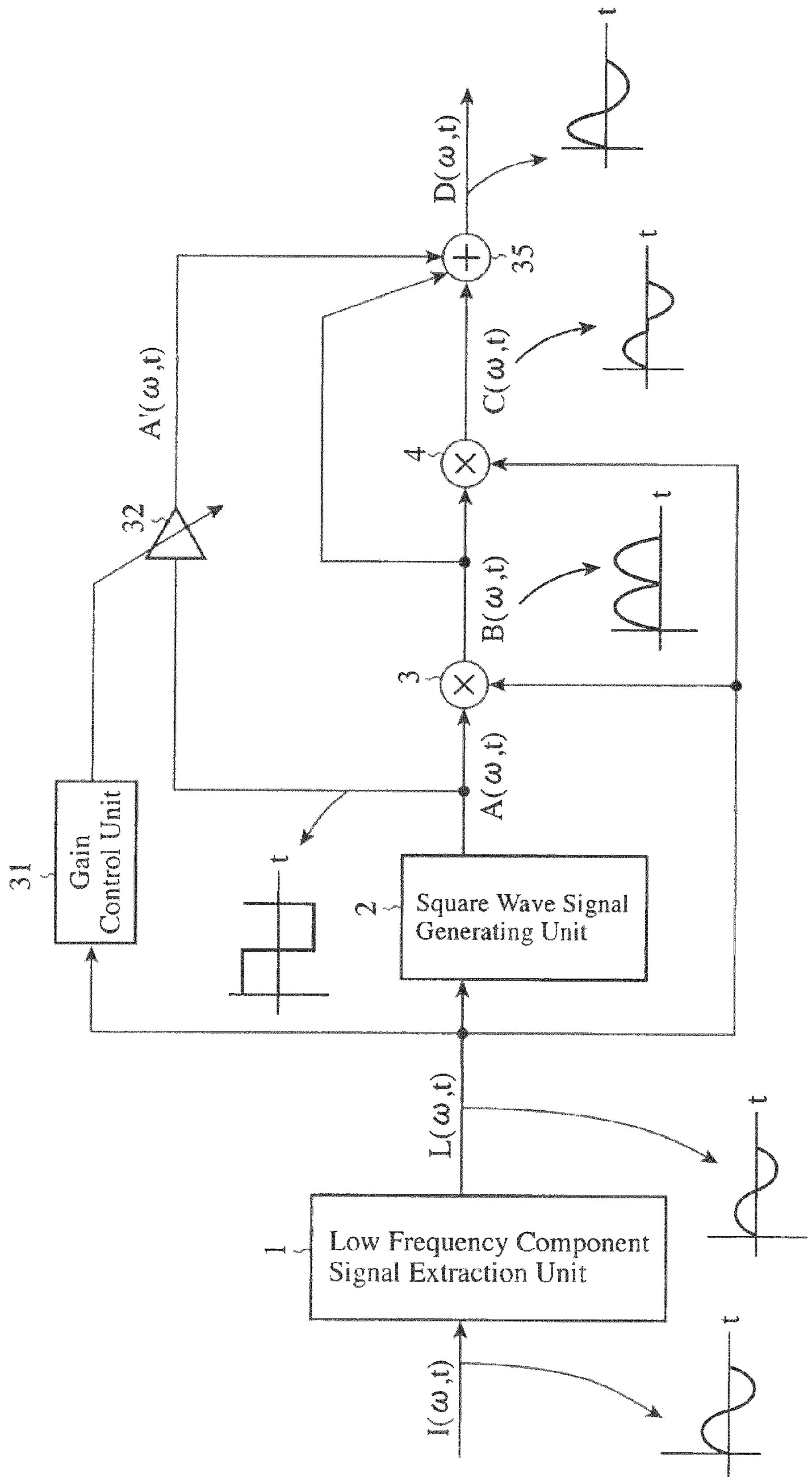
FIG. 10 is a block diagram showing a pseudo deep bass generating device in accordance with Embodiment 5 of the present invention.

In the example of FIG. 9, the two adders 33 and 34 are disposed, the adder 33 adds the square wave signal A'(ω,t) whose gain has been adjusted and the odd-order harmonic component signal C(ω,t), and the adder 34 adds the addition result (A'(ω,t)+C(ω,t)) of the adder 33 and the even-order harmonic component signal B(ω,t), as previously shown. As an alternative, as shown in FIG. 10, one adder 35 can add the square wave signal A'(ω,t) whose gain has been adjusted, the even-order harmonic component signal B(ω,t), and the odd-order harmonic component signal C(ω,t).

Embodiment 6.

Figure 11:
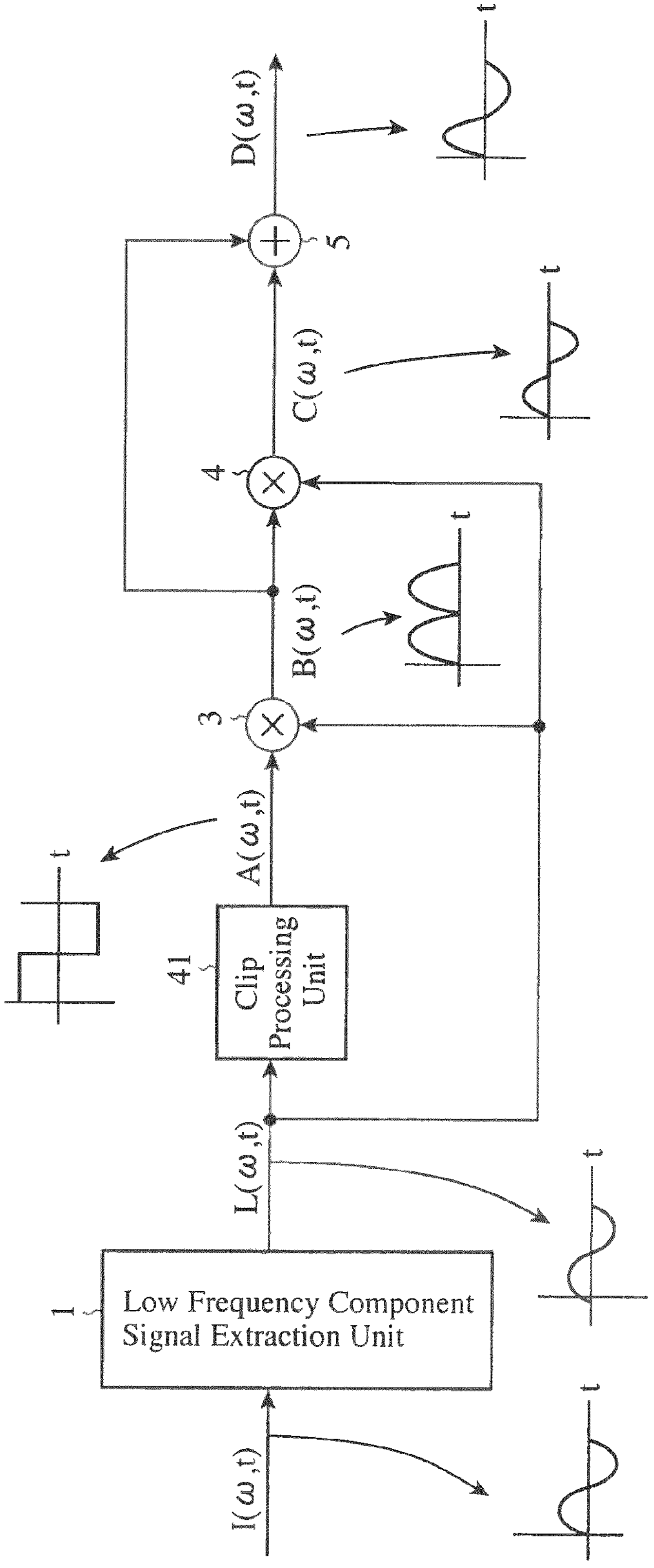
FIG. 11 is a block diagram showing a pseudo deep bass generating device in accordance with Embodiment 6 of the present invention.

FIG. 11 is a block diagram showing a pseudo deep bass generating device in accordance with Embodiment 6 of the present invention. In the figure, because the same reference numerals as those shown in FIG. 1 denote the same components or like components, the explanation of these components will be omitted hereafter.

A clip processing unit 41 carries out a process of compressing the amplitude value of a low frequency component signal L(ω,t) extracted by a low frequency component signal extraction unit 1, and outputting an amplitude value compression signal which is the low frequency component signal whose amplitude value has been compressed. More specifically, when the absolute value of the amplitude of the low frequency component signal L(ω,t) extracted by the low frequency component signal extraction unit 1 is larger than a predetermined threshold, the clip processing unit carries out a clip process of converting the absolute value of the amplitude of the low frequency component signal L(ω,t) into the above-mentioned threshold, and carries out a process of outputting, as the amplitude value compression signal, a clip signal E(ω,t) which is the clip-processed low frequency component signal. The clip processing unit 41 constructs an amplitude value compression signal generating means.

Next, the operation of the pseudo deep bass generating device will be explained.

In above-mentioned Embodiments 1 to 5, the square wave signal generating unit 2 generates the square wave signal A(ω,t) from the low frequency component signal L(ω,t), as previously shown. The square wave signal A(ω,t) has, as its amplitude value, either one of only "a" and "−a" (rarely include zero).

When generating a harmonic component signal D(ω,t), if the pseudo deep bass generating device carries out sampling frequency conversion and the generating processing at a lower sampling frequency in order to reduce the amount of arithmetic operation, the zero crossing point of the low frequency component signal L(ω,t) may displace from that of the square wave signal A(ω,t) and hence the low frequency component signal L(ω,t) and the square wave signal A(ω,t) may be out of phase with each other, and this results in degradation of the sound quality.

Figure 12:
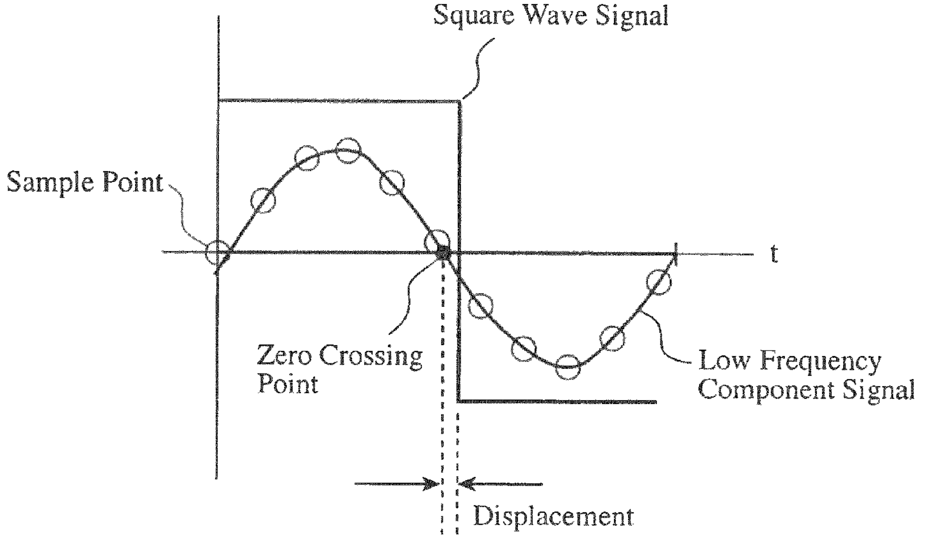
FIG. 12 is an explanatory drawing showing an example in which the square wave signal A(ω,t) is generated from the low frequency component signal L(ω,t)

FIG. 12 is an explanatory drawing showing an example in which the square wave signal A(ω,t) is generated from the low frequency component signal L(ω,t).

Therefore, in accordance with this Embodiment 6, the pseudo deep bass generating device generates a clip signal E(ω,t) in such a way that the displacement of the zero crossing point of the clip signal becomes smaller than that of the square wave signal A(ω,t) even though the pseudo deep bass generating device carries out sampling frequency conversion and the generating processing at a lower sampling frequency.

Figure 13:
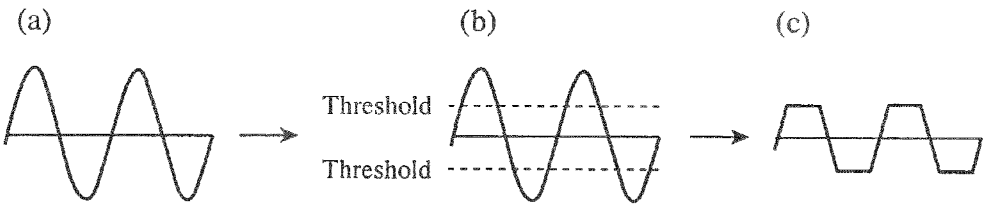
FIG. 13 is an explanatory drawing showing an example of a clip process carried out by a clip processing unit 41.
Figure 14:
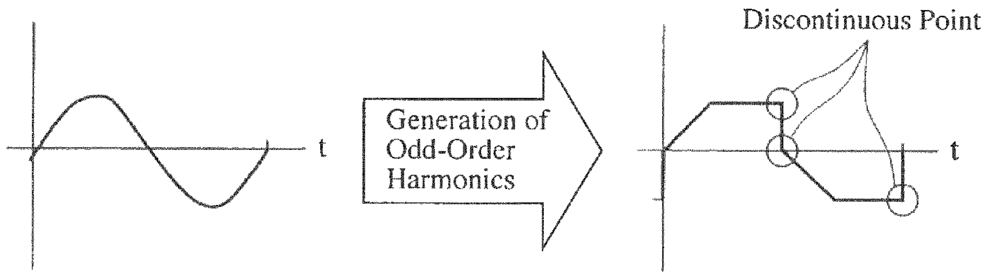
FIG. 14 is an explanatory drawing showing an example of generation of the odd-order harmonic component signal with peak holding in the form of time waveforms.

FIG. 13 is an explanatory drawing showing an example of the clip process carried out by the clip processing unit 41.

In the figure, (a) shows the time waveform of the low frequency component signal L(ω,t), (b) shows a relation between the low frequency component signal L(ω,t) and the threshold, and (c) shows the result of the absolute value of the amplitude which has been converted because the absolute value exceeds the threshold, and the waveform of the low frequency component signal L(ω,t) which has been clipped.

When the low frequency component signal extraction unit 1 extracts the low frequency component signal L(ω,t), the clip processing unit 41 compares the absolute value of the amplitude of the low frequency component signal L(ω,t) with the predetermined threshold. When the absolute value of the amplitude of the low frequency component signal L(ω,t) is equal to or small than the threshold, the clip processing unit 41 does not carry out the clip process of converting the absolute value of the amplitude of the low frequency component, so that the low frequency component signal remains having an amplitude value which is equal to or small than the threshold and is close to the zero crossing point. Therefore, even though the pseudo deep bass generating device carries out sampling frequency conversion and the generating processing at a lower sampling frequency, because the low frequency component signal remains having an amplitude value which is close to the zero crossing point, the displacement between the zero crossing point of the clip signal in the case of processing the amplitude value compression signal as the clip signal and that of the low frequency component signal L(ω,t) is smaller than the displacement between the zero crossing point of the square wave signal A(ω,t) in the case of processing the amplitude value compression signal as the square wave signal and that of the low frequency component signal L(ω,t).

In contrast, when the absolute value of the amplitude of the low frequency component signal L(ω,t) is larger than the threshold, the clip processing unit carries out the clip process of converting the absolute value of the amplitude of the low frequency component signal L(ω,t) into the above-mentioned threshold, as shown in FIG. 13(*c*), and outputs the clip-processed low frequency component signal as the clip signal E(ω,t).

The clip processing unit 41 can generate the clip signal E(ω,t) which is close to the square wave signal A(ω,t) by setting the threshold which is compared with the absolute value of the amplitude of low frequency component signal L(ω,t) to be smaller.

Because processes including the process done by the multiplier 3 and subsequent processes are the same as those of any of above-mentioned Embodiments 1 and 5 with the exception that the clip signal E(ω,t) is used instead of the square wave signal A(ω,t), the explanation of the processes will be omitted hereafter.

As can be seen from the above description, in accordance with this embodiment 6, when the absolute value of the amplitude of the low frequency component signal L(ω,t) extracted by the low frequency component signal extraction unit 1 is larger than the predetermined threshold, the clip processing unit 41 is so constructed as to carry out the clip process of converting the absolute value of the amplitude of the low frequency component signal L(ω,t) into the above-mentioned threshold, and then outputs the clip-processed low frequency component signal as the clip signal E(ω,t), the displacement of the zero crossing point of the clip signal from that of the low frequency component signal L(ω,t) becomes small even though the pseudo deep bass generating device carries out sampling frequency conversion and the generating processing at a lower sampling frequency. Therefore, the present embodiment offers an advantage of being able to implement reproduction of a natural sound whose tone quality is closer to that of the input signal.

What is claimed is:

1. A pseudo deep bass generating device comprising:
- a low frequency component signal extraction means for extracting a low frequency component signal from an input signal;
- an amplitude value compression signal generation means for compressing an amplitude value of the low frequency component signal extracted by said low frequency component signal extraction means to output an amplitude value compression signal which is the low frequency component signal whose amplitude value has been compressed;
- a first multiplication means for multiplying the amplitude value compression signal generated by said amplitude value compression signal generation means by the low frequency component signal extracted by said low frequency component signal extraction means so as to output an even-order harmonic component signal which is a result of the multiplication of said amplitude value compression signal by said low frequency component signal;
- a second multiplication means for multiplying the even-order harmonic component signal outputted from said first multiplication means by the low frequency component signal extracted by said low frequency component signal extraction means so as to output an odd-order harmonic component signal which is a result of the multiplication of said even-order harmonic component signal by said low frequency component signal; and
- an adding means for adding the even-order harmonic component signal outputted from said first multiplication means and the odd-order harmonic component signal outputted from said second multiplication means so as to output a harmonic component signal which is a result of the addition of said even-order harmonic component signal and said odd-order harmonic component signal.

2. The pseudo deep bass generating device according to claim 1, characterized in that the amplitude value compression signal generating means generates, as the amplitude value compression signal, a square wave signal having a positive amplitude value if the low frequency component signal extracted by the low frequency component signal extraction means has a positive sign, or a negative amplitude value if said low frequency component signal has a negative sign.

3. The pseudo deep bass generating device according to claim 1, characterized in that when an absolute value of the amplitude of the low frequency component signal extracted by the low frequency component signal extraction means is larger than a predetermined threshold, the amplitude value compression signal generating means carries out a clip process of converting the absolute value of the amplitude of said low frequency component signal into said threshold, and outputting the clip-processed low frequency component signal as the amplitude value compression signal.

4. The pseudo deep bass generating device according to claim 1, characterized in that said device comprises a dc component removing means for removing a dc component from the even-order harmonic component signal outputted from the first multiplication means so as to output the even-order harmonic component signal from which the dc component has been removed to the adding means.

5. The pseudo deep bass generating device according to claim 1, characterized in that said device comprises a gain adjustment means for adjusting a gain of the even-order harmonic component signal outputted from the first multiplication means so as to output the even-order harmonic component signal whose gain has been adjusted to the adding means, and for adjusting a gain of the odd-order harmonic component signal outputted from the second multiplication means so as to output the odd-order harmonic component signal whose gain has been adjusted to said adding means.

6. The pseudo deep bass generating device according to claim 1, characterized in that said device comprises a waveform shaping means for removing high-order harmonic components each having predetermined order or higher order from the harmonic component signal outputted from the adding means.

7. The pseudo deep bass generating device according to claim 1, characterized in that said device comprises a gain adjustment means for adjusting a gain of the amplitude value compression signal generated by the amplitude value compression signal generating means according to a gain of the low frequency component signal extracted by the low frequency component signal extraction means, and the adding means comprises a first adder for adding the amplitude value compression signal whose gain has been adjusted by said gain adjustment means and the odd-order harmonic component signal outputted from the second multiplication means, and a second adder for adding a result of the addition by said first adder and the even-order harmonic component signal outputted from the first multiplication means.

8. The pseudo deep bass generating device according to claim 1, characterized in that said device comprises a gain adjustment means for adjusting a gain of the amplitude value compression signal generated by the amplitude value compression signal generating means according to a gain of the low frequency component signal extracted by the low frequency component signal extraction means, and the adding means comprises an adder for adding the amplitude value compression signal whose gain has been adjusted by said gain adjustment means, the even-order harmonic component signal outputted from the first multiplication means, and the odd-order harmonic component signal outputted from the second multiplication means.

* * * * *